(12) United States Patent
Williams et al.

(10) Patent No.: US 9,117,817 B2
(45) Date of Patent: Aug. 25, 2015

(54) SEMICONDUCTOR DEVICES INCLUDING POLAR INSULATION LAYER CAPPED BY NON-POLAR INSULATION LAYER

(71) Applicants: John R. Williams, Opelika, AL (US); Ayayi C. Ahyi, Auburn, AL (US); Tamara F. Isaacs-Smith, Auburn, AL (US); Yogesh K. Sharma, Kenilworth (GB); Leonard C. Feldman, New Brunswick, NJ (US)

(72) Inventors: John R. Williams, Opelika, AL (US); Ayayi C. Ahyi, Auburn, AL (US); Tamara F. Isaacs-Smith, Auburn, AL (US); Yogesh K. Sharma, Kenilworth (GB); Leonard C. Feldman, New Brunswick, NJ (US)

(73) Assignees: Auburn University, Auburn, AL (US); Rutgers, The State University of New Jersey, New Brunswick, NJ (US)

( * ) Notice: Subject to any disclaimer, the term of this patent is extended or adjusted under 35 U.S.C. 154(b) by 0 days.

(21) Appl. No.: 14/027,817

(22) Filed: Sep. 16, 2013

(65) Prior Publication Data

US 2014/0077227 A1     Mar. 20, 2014

Related U.S. Application Data

(60) Provisional application No. 61/701,068, filed on Sep. 14, 2012.

(51) Int. Cl.
*H01L 21/336* (2006.01)
*H01L 29/51* (2006.01)
*H01L 21/04* (2006.01)
*H01L 29/78* (2006.01)

(52) U.S. Cl.
CPC ............ *H01L 29/513* (2013.01); *H01L 21/045* (2013.01); *H01L 21/049* (2013.01); *H01L 29/517* (2013.01); *H01L 29/78* (2013.01)

(58) Field of Classification Search
CPC .............. H01L 21/02378; H01L 21/02447; H01L 29/51; H01L 29/513; H01L 29/1608; H01L 21/045; H01L 21/049
USPC ............ 438/478, 285, 289; 257/76, 77
See application file for complete search history.

(56) References Cited

U.S. PATENT DOCUMENTS

| | | | |
|---|---|---|---|
| 6,274,424 B1 * | 8/2001 | White et al. | 438/239 |
| 2005/0236676 A1 * | 10/2005 | Ueno | 257/379 |
| 2008/0090371 A1 * | 4/2008 | Yamashita et al. | 438/381 |
| 2012/0223330 A1 | 9/2012 | Dhar et al. | |

OTHER PUBLICATIONS

Y.K. Sharma et al., "High-Mobility Stable 4H-SiC MOSFETs Using a Thin PSG Interfacial Passivation Layer," IEEE Electron Device Letters, Feb. 2013, pp. 175-177, vol. 34, No. 2.
Y.K. Sharma et al., "Phosphorous passivation of the SiO2/4H—SiC interface," Solid State Electronics, Nov. 16, 2011, pp. 103-107, vol. 68.
E.H. Snow & B.E. Deal, "Polarization Phenomena and Other Properties of Phosphosilicate Glass Films on Silicon," Journal of the Electrochemical Society, Mar. 1966, pp. 263-269, vol. 113, No. 3.

* cited by examiner

*Primary Examiner* — Brook Kebede
(74) *Attorney, Agent, or Firm* — Barnes & Thornburg LLP

(57) ABSTRACT

Illustrative embodiments of semiconductor devices including a polar insulation layer capped by a non-polar insulation layer, and methods of fabrication of such semiconductor devices, are disclosed. In at least one illustrative embodiment, a semiconductor device may comprise a semiconductor substrate, a polar insulation layer disposed on the semiconductor substrate and comprising a Group V element configured to increase a carrier mobility in at least a portion of the semiconductor substrate, and a non-polar insulation layer disposed above the polar insulation layer.

19 Claims, 3 Drawing Sheets

SEMICONDUCTOR DEVICES INCLUDING POLAR INSULATION LAYER CAPPED BY NON-POLAR INSULATION LAYER

CROSS-REFERENCE TO RELATED APPLICATION

This application claims priority under 35 U.S.C. §119(e) to U.S. Provisional Patent Application Ser. No. 61/701,068, filed on Sep. 14, 2012, and entitled "Improved Threshold Voltage Stability Using Thin Phosphosilicate Glass Layers for the Fabrication of SiC MOSFETs Passivated with Phosphorous," the entire disclosure of which is expressly incorporated herein by reference.

STATEMENT REGARDING FEDERALLY SPONSORED RESEARCH

This invention was made with government support under Grant No. W911NF-07-2-0046, awarded by the U.S. Army Research Laboratory, and Grant No. DMR-0907385, awarded by the National Science Foundation. The government has certain rights in the invention.

BACKGROUND

Silicon carbide (SiC) is an advanced material typically used in power electronics, as it is a wide band gap semiconductor ($E_g$=3.26 eV) with a low intrinsic carrier concentration ($n_i$=5×10$^{-9}$ cm$^{-3}$), high electric field of breakdown ($E_b$=2.2 MV/cm), and high thermal conductivity ($\kappa$=3.0-3.8 W/cm-K). Furthermore, SiC is the only wide band gap semiconductor that has silicon dioxide ($SiO_2$) as a native oxide. Due in part to these advantageous properties, SiC has been used in power semiconductor devices, such as Schottky diodes and metal-oxide-semiconductor field-effect transistors (MOSFETs), for automobiles, power converters, defense applications, and other systems.

SiC MOSFETs have historically been plagued by very low carrier mobility in the inversion channel, resulting from a high density of interface traps at the $SiC/SiO_2$ interface. Significant progress has been made with respect to interface passivation over the last decade. In particular, nitric oxide (NO) post-oxidation annealing has been shown to provide an acceptable channel mobility of around 35 cm$^2$/V-s in SiC MOSFETs. However, this value is only about 4% of the bulk mobility of 4H—SiC (which is about 800-1000 cm$^2$/V-s). As such, the channel resistance (which is inversely proportional to the inversion channel carrier mobility) in state-of-the-art 4H—SiC power MOSFETs still contributes to about half the total conduction loss.

Recent research has indicated that phosphorus passivation (P-passivation) of a $SiC/SiO_2$ interface is more effective than NO passivation, providing peak mobilities of 80-90 cm$^2$/V-s. However after typical P-passivation, the oxide is no longer $SiO_2$ but, rather, is transformed to phosphosilicate glass (PSG). In MOSFETs including an insulation layer of PSG, the polar characteristics of the PSG will typically cause threshold voltage instabilities, rendering the MOSFETs unstable and of little or no practical use.

SUMMARY

According to one aspect, a semiconductor device may comprise a semiconductor substrate, a polar insulation layer disposed on the semiconductor substrate and comprising a Group V element configured to increase a carrier mobility in at least a portion of the semiconductor substrate, and a non-polar insulation layer disposed above the polar insulation layer.

In some embodiments, a thickness of the polar insulation layer may be less than fifty percent of a combined thickness of the polar and non-polar insulation layers. The thickness of the polar insulation layer may be less than twenty-five percent of the combined thickness of the polar and non-polar insulation layers. The thickness of the polar insulation layer may be between five percent and fifteen percent of the combined thickness of the polar and non-polar insulation layers. The thickness of the polar insulation layer and the combined thickness of the polar and non-polar insulation layers may both be measured along a hypothetical axis that is normal to an interface between the semiconductor substrate and the polar insulation layer.

In some embodiments, the thickness of the polar insulation layer is less than ten nanometers. The thickness of the polar insulation layer may be between seven and ten nanometers. The thickness of the polar insulation layer may be measured along a hypothetical axis that is normal to an interface between the semiconductor substrate and the polar insulation layer.

In some embodiments, the semiconductor device may further comprise a gate contact disposed above the non-polar insulation layer, a first well formed in the semiconductor substrate adjacent to a first side of the polar insulation layer, and a second well formed in the semiconductor substrate adjacent to a second side of the polar insulation layer, where the second side is opposite the first side. The semiconductor substrate may have a first conductivity type and the first and second wells may have a second conductivity type, where the second conductivity type is opposite the first conductivity type.

In some embodiments, the semiconductor substrate may comprise silicon carbide. The polar insulation layer may comprise phosphosilicate glass and the Group V element may be phosphorus. The non-polar insulation layer may comprise silicon dioxide.

In some embodiments, the semiconductor device may further comprise a barrier layer disposed between the polar and non-polar insulation layers, where the barrier layer is configured to reduce diffusion of the Group V element from the polar insulation layer into the non-polar insulation layer. The thickness of the barrier layer may be less than a thickness of the polar insulation layer. The barrier layer may comprise a nitride.

According to another aspect, a semiconductor device may comprise a silicon carbide substrate, a phosphosilicate glass (PSG) layer disposed on the silicon carbide substrate, and a silicon dioxide ($SiO_2$) layer disposed above the PSG layer. A thickness of the PSG layer may be less than fifty percent of a combined thickness of the PSG and $SiO_2$ layers.

In some embodiments, the thickness of the PSG layer may be less than twenty-five percent of the combined thickness of the PSG and $SiO_2$ layers. The thickness of the PSG layer may be between five percent and fifteen percent of the combined thickness of the PSG and $SiO_2$ layers.

According to yet another aspect, a method of fabricating a semiconductor device may comprise forming a polar insulation layer on a semiconductor substrate, where the polar insulation layer comprises a Group V element configured to increase a carrier mobility in at least a portion of the semiconductor substrate, and forming a non-polar insulation layer above the polar insulation layer, such that a thickness of the non-polar insulation layer is greater than fifty percent of a combined thickness of the polar and non-polar insulation layers.

In some embodiments, forming the polar insulation layer on the semiconductor substrate may comprise forming a phosphosilicate glass layer on a silicon carbide substrate. Forming the phosphosilicate glass layer may comprise growing a thermal oxide layer on the silicon carbide substrate and annealing the thermal oxide layer in a gas comprising phosphorus to convert the thermal oxide layer to the phosphosilicate glass layer.

In some embodiments, the thickness of the non-polar insulation layer may be greater than seventy-five percent of a combined thickness of the polar and non-polar insulation layers. The thickness of the non-polar insulation layer may be between eighty-five percent and ninety-five percent of a combined thickness of the polar and non-polar insulation layers.

In some embodiments, forming the non-polar insulation layer above the polar insulation layer may comprise forming the non-polar insulation layer on the polar insulation layer. In other embodiments, the method may further comprise forming a barrier layer on the polar insulation layer prior to forming the non-polar insulation layer above the polar insulation layer, where the barrier layer is configured to reduce diffusion of the Group V element from the polar insulation layer into the non-polar insulation layer.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
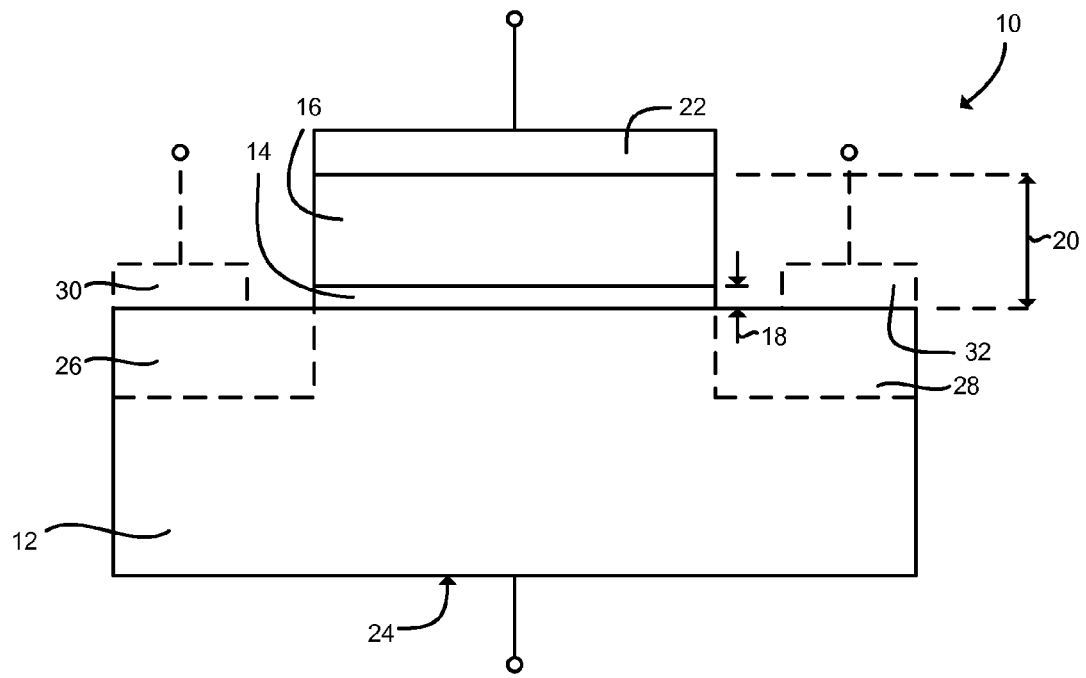
FIG. 1 is a simplified cross-sectional diagram of one illustrative embodiment of a semiconductor device including a polar insulation layer capped by a non-polar insulation layer.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the present disclosure.

References in the specification to "one embodiment," "an embodiment," "an example embodiment," etcetera, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Relative terms such as "above" or "below," "upper" or "lower," "vertical" or "horizontal," and similar terms may be used herein to describe a relationship of one element, layer, or region to another element, layer, or region as illustrated in the drawings. It will be understood that such terms are intended to encompass different orientations of the device(s), in addition to the orientation depicted in the drawings. When an element such as a layer, region, or substrate is referred to herein as being "above" or "below" another element, it may be in direct contact with the other element, or intervening elements may be present. In contrast, when an element is referred to herein as being "on" another element, it is in direct contact with the other element, with no intervening elements present.

The present disclosure relates to semiconductor devices including a polar insulation layer capped by a non-polar insulation layer, as well as methods of fabricating such semiconductor devices. For instance, one such illustrative semiconductor device may include a silicon carbide substrate that has been passivated with phosphorus to improve carrier mobility and a polar insulation layer of phosphosilicate glass capped by a non-polar insulation layer of silicon dioxide. As described in detail below, the combination of the polar and non-polar insulation layers may improve threshold voltage stability of the semiconductor device while retaining improved carrier mobility in the semiconductor substrate. By way of example, such semiconductor devices may be used in high-power electronics.

Referring now to FIG. 1, a simplified cross-sectional diagram of one illustrative embodiment of a semiconductor device 10 is shown. The semiconductor device 10 includes a semiconductor substrate 12. In some embodiments, the substrate 12 may comprise SiC (for example, 4H—SiC) but, in other embodiments, other semiconductors might be used. The substrate 12 may be doped with an n-type or a p-type dopant. As one example, the substrate 12 may include n-epilayers grown on off-axis n-4H-wafers and moderately doped with nitrogen (e.g., ~$8.3 \times 10^{15}$ cm$^{-3}$). As another example, the substrate 12 may include p-epilayers grown on off-axis n$^-$ substrates and moderately doped with aluminum.

A polar insulation layer 14 is disposed on the substrate 12. The polar insulation layer 14 includes a Group V element configured to increase a carrier mobility in at least a portion of the substrate 12. The "Group V element" may be embodied as any element from the column of the periodic table beginning with nitrogen (i.e., "group 15" in the International Union of Pure and Applied Chemistry notation). In other words, the Group V element may be one or more elements selected from at least nitrogen, phosphorus, arsenic, antimony, and bismuth. For example, where the semiconductor device 10 has been subjected to P-passivation, the polar insulation layer 14 may include phosphorus. In such an embodiment, the polar insulation layer 14 may be embodied as a layer of PSG.

The polar insulation layer 14 is "capped" by a non-polar insulation layer 16. In other words, the non-polar insulation layer 16 is disposed above the polar insulation layer 14. In some embodiments, the non-polar insulation layer 16 may be silicon dioxide ($SiO_2$). In other embodiments, the non-polar insulation layer may be aluminum oxide ($Al_2O_3$), hafnium oxide ($HfO_2$), or a nitride. It is contemplated that, in still other embodiments, other non-polar insulating materials, or combinations thereof, may be used for the non-polar insulation layer 16. In the illustrative embodiment, the non-polar insulation layer 16 is relatively free of the Group V element included in the polar insulation layer 14. However, as described further below, small amounts of the Group V element may migrate into the non-polar insulation layer 16 through diffusion.

In the illustrative embodiment, the polar insulation layer 14 is relatively "thin," while the non-polar insulation layer 16 is relatively "thick." In other words, a thickness 18 of the polar insulation layer 14 may be relatively small compared to a combined thickness 20 of both the polar and non-polar insulation layers 14, 16. As shown in FIG. 1, both of the foregoing thicknesses 18, 20 are measured along a hypothetical axis that is normal to the interface between the substrate 12 and the polar insulation layer 14. In some embodiments, the thickness 18 may be less than fifty percent (i.e., one-half) of the combined thickness 20. In other embodiments, the thickness 18 may be less than twenty-five percent (i.e., one-quarter) of the combined thickness 20. In still other embodiments, such as the illustrative embodiment of FIG. 1, the thickness 18 may be between five percent and fifteen percent of the combined thickness 20. It is also contemplated that, in some embodiments, the thickness 18 may be less than five percent of the combined thickness 20.

In the illustrative embodiment, the combined thickness 20 of the polar and non-polar insulation layers 14, 16 is between about fifty nanometers and about seventy nanometers. Accordingly, in some embodiments, the thickness 18 of the polar insulation layer 14 may be less than about ten nanometers, such as, by way of example, between about seven nanometers and about ten nanometers. In other embodiments, the polar insulation layer 14 may be embodied as a monolayer; that is, the thickness 18 may be equivalent to the thickness of a single molecule.

The semiconductor device 10 further includes an electrical contact 22 disposed above the non-polar insulation layer 16. The electrical contact 22 may be embodied as a metal (e.g., nickel or molybdenum) or metal alloy deposited on the non-polar insulation layer 16. Alternatively, the electrical contact 22 may be embodied as a layer of heavily doped semiconductor. The semiconductor device 10 also includes an electrical contact 24 disposed below the substrate 12. For example, the electrical contact 24 may be embodied as a broad area, silver paste applied to a back side of the substrate 12 (i.e., a side of the substrate 12 opposite the polar insulation layer 14) after backside oxide removal. In such a configuration, the semiconductor device 10 may be illustratively embodied as a metal-oxide-semiconductor (MOS) capacitor.

In some illustrative embodiments, the semiconductor device 10 may further include a pair of wells 26, 28 formed in the substrate 12, adjacent opposite sides of the polar insulation layer 14. The wells 26, 28 may have a conductivity type opposite that of the substrate 12. For example, if the substrate 12 is doped with an n-type dopant, the wells 26, 28 may be doped with p-type dopant, or vice versa. Electrical contacts 30, 32 may be disposed above the wells 26, 28, respectively. Similar to the electrical contact 22, the electrical contacts 30, 32 may be embodied as a metal (e.g., nickel or molybdenum) or metal alloy deposited on wells 26, 28. Alternatively, the electrical contacts 30, 32 may be embodied as layers of heavily doped semiconductor. In such a configuration, the semiconductor device 10 may be embodied as a MOSFET, with the wells 26, 28 acting as a source and a drain of the MOSFET and the electrical contact 22 acting as a gate contact of the MOSFET.

Figure 2:
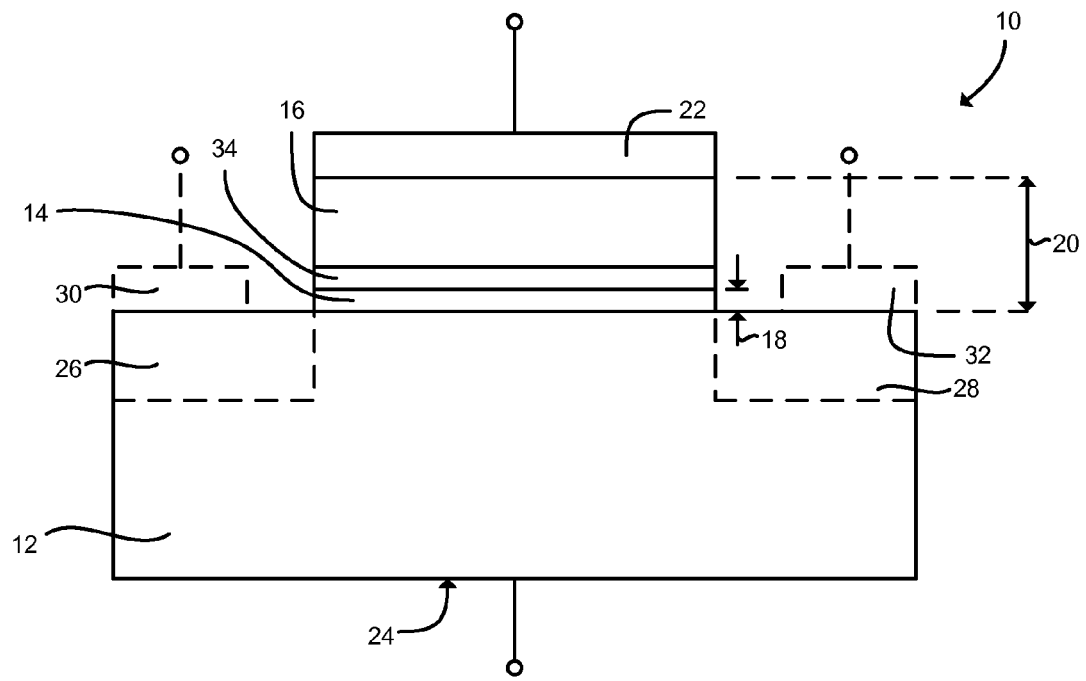
FIG. 2 is a simplified cross-sectional diagram of another illustrative embodiment of a semiconductor device including a polar insulation layer capped by a non-polar insulation layer.

Referring now to FIG. 2, a simplified cross-sectional diagram of another illustrative embodiment of a semiconductor device 10 is shown. The semiconductor device 10 of FIG. 2 has similar components to those shown in FIG. 1 (and described above), except that the semiconductor device 10 of FIG. 2 further includes a barrier layer 34 positioned between the polar insulation layer 14 and the non-polar insulation layer 16. The barrier layer 34 is configured to reduce diffusion, or other migration, of atoms of the Group V element from the polar insulation layer 14 into the non-polar insulation layer 16. In some embodiments, the barrier layer 34 may be a nitride, such as, by way of example, silicon nitride. In some embodiments, a thickness of the barrier layer 34 may be less than the thickness 18 (measured along the same hypothetical axis described above). For example, in some embodiments the thickness of the barrier layer 34 may be about two nanometers to about three nanometers.

Figure 3:
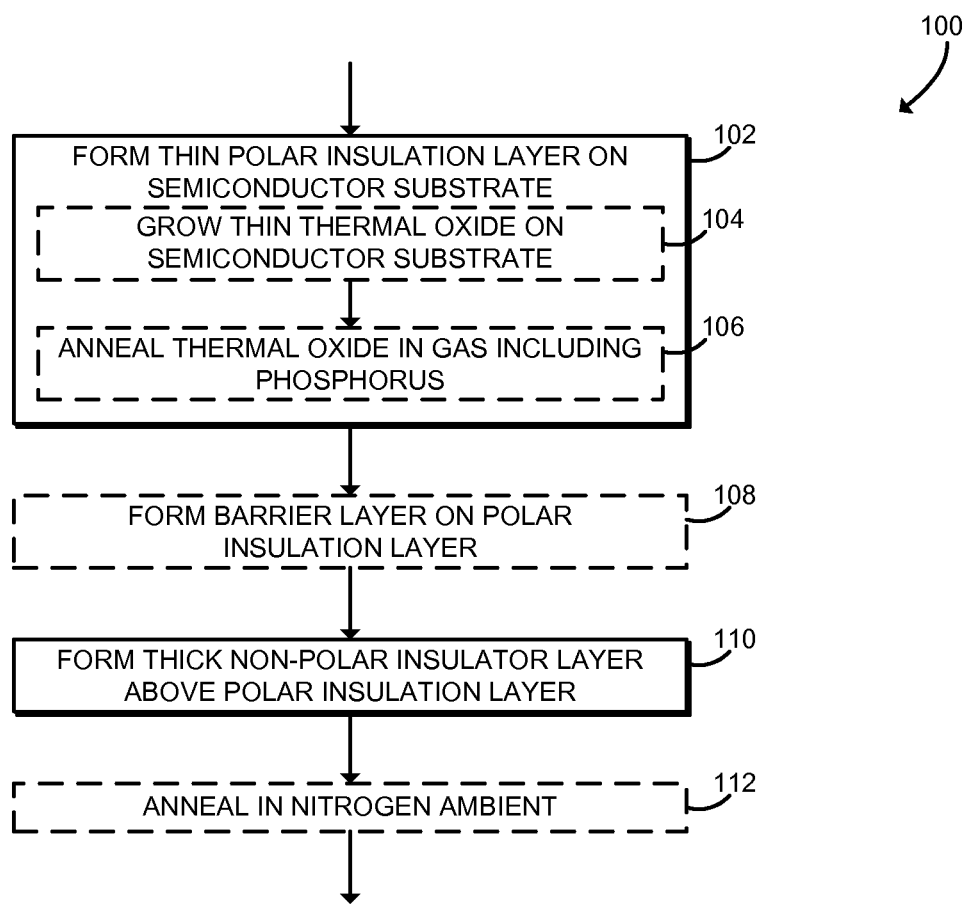
FIG. 3 is a simplified flow diagram of one illustrative embodiment of method of fabricating the semiconductor devices of FIGS. 1 and 2.

One illustrative embodiment of a method 100 that may be used to fabricate the semiconductor devices 10 is shown as a simplified flow diagram is shown in FIG. 3. The method 100 is illustrated as a series of blocks 102-112, some which may be optionally performed in some embodiments (and, thus, are shown in dashed lines). It will be appreciated by those of skill in the art that some embodiments of the method 100 may include additional or different processes and sub-processes, such as various pre- and post-processing techniques. For instance, any number of techniques may be used for forming the wells 26, 28 in the substrate 12 and/or depositing the electrical contracts 22, 24, 30, 32 of the semiconductor devices 10.

The method 100 may begin with block 102, in which the polar insulation layer 14 is formed on the substrate 12. The polar insulation layer 14 may be formed using any suitable technique, including, but not limited to, growing the polar insulation layer 14 on the substrate 12, atomic layer deposition of the polar insulation layer 14 on the substrate 12, or implantation of the Group V element into an insulation layer previously formed on the substrate 12. As described above, in some embodiments, the polar insulation layer 14 may be a thin layer of PSG. In such embodiments, block 102 may involve forming the thin PSG layer 14 by first growing a thermal oxide layer (e.g., $SiO_2$) on the substrate 12 (as indicated in block 104) and then annealing the thermal oxide layer in a gas including phosphorus (as indicated in block 106). For example, in one illustrative embodiment, the thermal oxide may be grown at a temperature of 1150° C. to a thickness of about six nanometers to about eight nanometers. The thermal oxide may then be annealed in a planar diffusion source furnace for two hours at 1000° C. During the annealing process, the thermal oxide layer is exposed to a vapor containing phosphorus, such as $P_2O_5$ vapor, and the thermal oxide layer is converted to PSG. As another example, block 106 may involve bubbling gas through liquid $POCl_3$ to generate the gas including phosphorus. The foregoing embodiment of block 102 will result in a thin PSG layer 14 with a thickness 18 of about 10 nanometers.

In some embodiments, the method 100 may optionally proceed from block 102 to block 108, in which the barrier layer 34 is formed on the polar insulation layer 14. As described above, the barrier layer 34 is configured to prevent diffusion of the Group V element from the polar insulation layer 14 into the non-polar insulation layer 16 and may be embodied as a nitride. The barrier layer 34 may be formed using any suitable technique, including, but not limited to, low-pressure chemical vapor deposition (CVD) or plasma-enhanced CVD.

After block 108 (or after block 102, in embodiments not employing block 106), the method 100 proceeds to block 110, in which the non-polar insulation layer 16 is formed above the polar insulation layer 14. For instance, the non-polar insulation layer 16 may be formed either on the polar insulation layer 14 or on the barrier layer 34. The non-polar insulation layer 16 may be formed using any suitable technique. For instance, in some embodiments, a SiO$_2$ layer 16 may be formed by cracking tetraethylorthosilicate (TEOS) at 650° C. and 0.6 Torr in a low pressure chemical vapor deposition system. In such embodiments, the resulting SiO$_2$ layer 16 may have a thickness of about 35 nanometers. Additionally or alternatively, the non-polar insulation layer 16 (or portions thereof) may be formed using atomic layer deposition, plasma-enhanced CVD, high-temperature oxidation, and/or sputter deposition.

After block 110, the method 100 may optionally proceed to block 112, in which the semiconductor device 10 may be annealed in a nitrogen ambient to improve the breakdown characteristics of the non-polar insulation layer 16. For example, the non-polar insulation layer 16 may be annealed in nitrogen for two hours at 850° C. In other embodiments of the method 100, block 112 may involve annealing the semiconductor device 10 in an inert gas (e.g., Argon).

Figure 4:
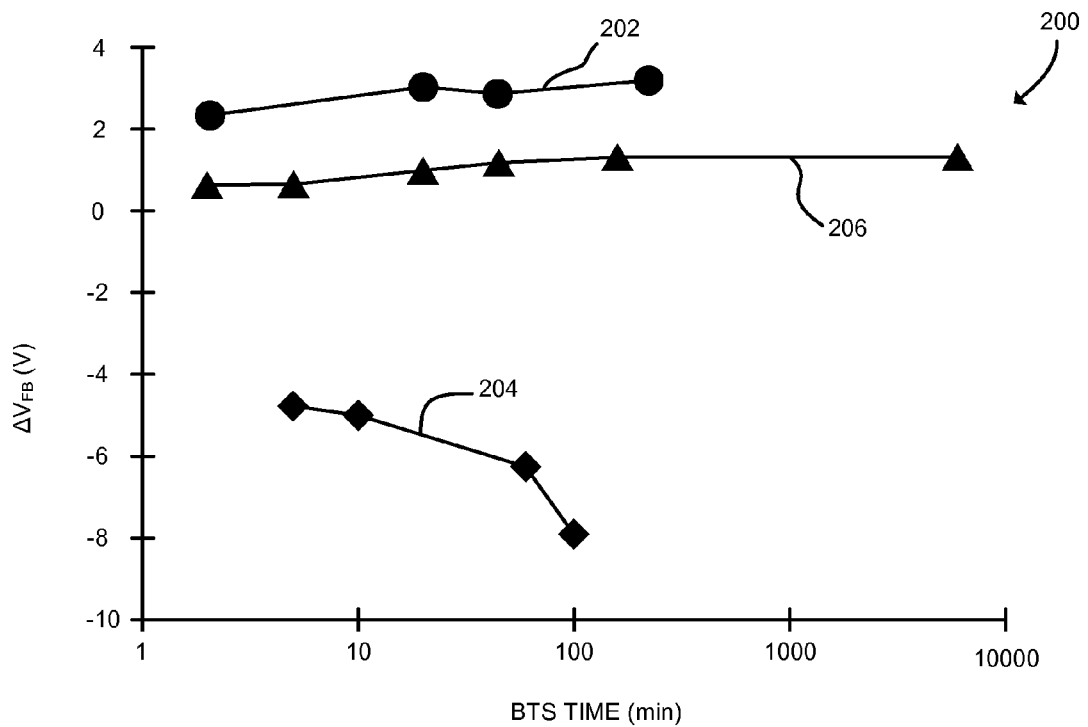
FIG. 4 is an exemplary plot of change in flatband voltage versus bias-temperature-stress time for several semiconductor devices.

Referring now to FIG. 4, an exemplary plot 200 illustrates experimental results of bias-temperature stress (BTS) measurements for various MOS capacitors. In particular, the plot 200 illustrates the shift in flat band voltage ($\Delta V_{FB}$) versus BTS time. Curve 202 illustrates various measurements for MOS capacitors passivated with nitric oxide (NO). Curve 204 illustrates various measurements for MOS capacitors passivated in phosphorous, including a relatively thick layer of PSG, having a thickness of about 90 nanometers. Curve 206 illustrates various measurements for MOS capacitors constructed according to the present disclosure. Positive biases were applied at 150° C. for all samples, and the electric field was 1.5 MV/cm during measurements. The flat band voltage ($V_{FB}$) was measured before and after BTS for each MOS capacitor for each of the BTS times indicated. As can be seen by comparing the curves 204, 206, the $V_{FB}$ is more stable for the semiconductor devices 10 than for the MOS capacitors with a thick PSG layer. As can be seen by comparing the curves 202, 206, the $V_{FB}$ stability for the semiconductor devices 10 is similar to the stability of nitrogen-passivated semiconductor devices. In fact, the maximum shift in the flat band voltage may be less than 1.5 V for the semiconductor devices 10. Additionally, the shifts in the $V_{FB}$ for the semiconductor devices 10 are positive, whereas negative shifts are observed for the MOS capacitors with a thick PSG layer. Furthermore, it was experimentally determined that the threshold voltage $V_{TH}$ for semiconductor devices 10 following eight hours of positive BTS shifts by less than 0.5 V, which signifies improved stability. Mobility curves for the semiconductor devices 10 before and after eight hours of positive BTS indicate only a small right shift (about 0.3 V) in the mobility curve with no change in the peak value of the mobility, which is further evidence of improved stability in the semiconductor devices 10.

The flat band voltage shift ($\Delta V_{FB}$) may be described by the following equation:

$$\Delta V_{FB} = \frac{Q_p}{C_g} = \frac{Q_p t_g}{\varepsilon_o K_g} = \left(\frac{t_g}{t_o}\right) \frac{K_o \chi_p V_p}{K_g \left[(K_g + \chi_p) + \frac{K_o t_g}{t_o}\right]}, \quad (1)$$

in which $Q_p$ represents the polarization charge, $C_g$ represents the PSG layer capacitance, $t_g$ represents the PSG layer thickness, $t_o$ represents the oxide layer thickness, $K_g$ represents the PSG dielectric constant, $K_o$ represents the oxide dielectric constant, $\varepsilon_o$ represents the oxide permittivity, $x_p$ represents the PSG polarizability, and $V_p$ represents the applied voltage during BTS. Pursuant to equation (1), it is believed that the flat band voltage shift—and, thus, the threshold voltage shift—will be proportional to the ratio of the thickness 18 of the polar insulation layer 14 to the thickness of the non-polar insulation layer 16.

Figure 5:
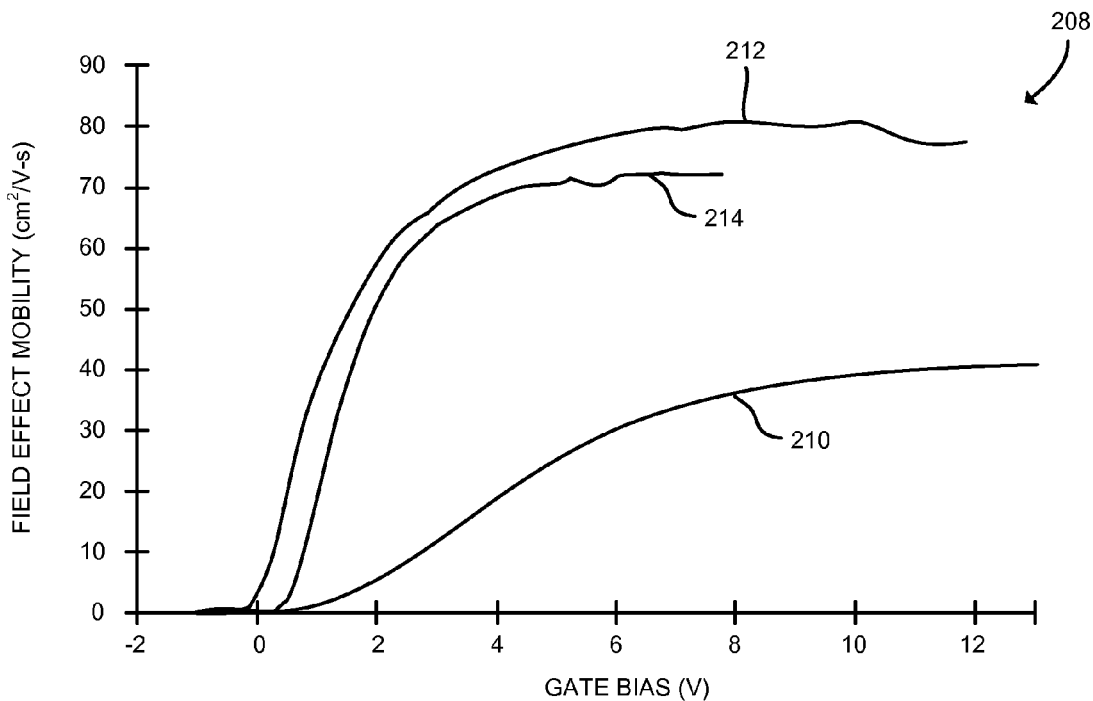
FIG. 5 is an exemplary plot of field effect mobility versus gate bias for several semiconductor devices.

Referring now to FIG. 5, an exemplary plot 208 illustrates experimental results regarding field effect mobility for various lateral n-channel 4H—SiC MOSFETS. Curve 210 illustrates field effect mobility for a MOSFET passivated in nitric oxide (NO). Curve 212 illustrates field effect mobility for a MOSFET having a thick PSG layer (namely, the entire gate oxide layer comprising PSG). Curve 214 illustrates field effect mobility for a MOSFET fabricated according to the present disclosure. As can be seen from curve 214, the semiconductor device 10 has a peak mobility of 72 cm$^2$/V-s, which is about two times greater than the peak mobility of the nitrogen-passivated MOSFET shown by curve 210. As described above, the increased mobility in the semiconductor device 10 compared to nitrogen-passivated devices may be caused by reduced interface trap density resulting from P-passivation. Results of high-low (e.g., 1 MHz/quasi-static) capacitance-voltage (C-V) measurements performed at room temperature have determined that interface trap densities for the semiconductor devices 10 are about two times lower than for nitrogen-passivated MOS capacitors. Additionally, the peak mobility of the semiconductor devices 10 are slightly lower than the peak mobility of the thick PSG MOSFETs (represented by curve 212). However, as discussed above in connection with FIG. 4, such thick PSG MOSFETs suffer from threshold voltage instability.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present disclosure.

The invention claimed is:

1. A semiconductor device comprising:
   a semiconductor substrate;
   a polar insulation layer disposed on the semiconductor substrate, the polar insulation layer comprising a Group V element configured to increase a carrier mobility in at least a portion of the semiconductor substrate;
   a non-polar insulation layer disposed above the polar insulation layer;
   a gate contact disposed above the non-polar insulation layer;
   a first well formed in the semiconductor substrate adjacent to a first side of the polar insulation layer; and
   a second well formed in the semiconductor substrate adjacent to a second side of the polar insulation layer, the second side being opposite the first side;
   wherein the semiconductor substrate has a first conductivity type and the first and second wells have a second conductivity type, the second conductivity type being opposite the first conductivity type.

2. The semiconductor device of claim 1, wherein a thickness of the polar insulation layer is less than fifty percent of a combined thickness of the polar and non-polar insulation layers.

3. The semiconductor device of claim 2, wherein the thickness of the polar insulation layer is less than twenty-five percent of the combined thickness of the polar and non-polar insulation layers.

4. The semiconductor device of claim 3, wherein the thickness of the polar insulation layer is between five percent and fifteen percent of the combined thickness of the polar and non-polar insulation layers.

5. The semiconductor device of claim 4, wherein the thickness of the polar insulation layer and the combined thickness of the polar and non-polar insulation layers are both measured along an axis that is normal to an interface between the semiconductor substrate and the polar insulation layer.

6. The semiconductor device of claim 1, wherein the thickness of the polar insulation layer is less than ten nanometers.

7. The semiconductor device of claim 6, wherein the thickness of the polar insulation layer is between seven and ten nanometers.

8. The semiconductor device of claim 7, wherein the thickness of the polar insulation layer is measured along an axis that is normal to an interface between the semiconductor substrate and the polar insulation layer.

9. The semiconductor device of claim 1, wherein the semiconductor substrate comprises silicon carbide.

10. The semiconductor device of claim 9, wherein the polar insulation layer comprises phosphosilicate glass and the Group V element is phosphorus.

11. The semiconductor device of claim 10, wherein the non-polar insulation layer comprises silicon dioxide.

12. A semiconductor device comprising:
    a silicon carbide substrate;
    a phosphosilicate glass (PSG) layer disposed on the silicon carbide substrate;
    a silicon dioxide (SiO2) layer disposed above the PSG layer;
    a gate contact disposed above the SiO2 layer;
    a first well formed in the silicon carbide substrate adjacent to a first side of the PSG layer; and
    a second well formed in the silicon carbide substrate adjacent to a second side of the PSG layer, the second side being opposite the first side;
    wherein the silicon carbide substrate has a first conductivity type and the first and second wells have a second conductivity type, the second conductivity type being opposite the first conductivity type; and
    wherein a thickness of the PSG layer is less than fifty percent of a combined thickness of the PSG and SiO2 layers.

13. The semiconductor device of claim 12, wherein the thickness of the PSG layer is less than twenty-five percent of the combined thickness of the PSG and SiO2 layers.

14. The semiconductor device of claim 12, wherein the thickness of the PSG layer is between five percent and fifteen percent of the combined thickness of the PSG and SiO2 layers.

15. A method of fabricating a semiconductor device, the method comprising:
    forming a polar insulation layer on a semiconductor substrate, the polar insulation layer comprising a Group V element configured to increase a carrier mobility in at least a portion of the semiconductor substrate;
    forming a non-polar insulation layer above the polar insulation layer, such that a thickness of the non-polar insulation layer is greater than fifty percent of a combined thickness of the polar and non-polar insulation layers;
    forming a gate contact above the non-polar insulation layer;
    forming a first well in the semiconductor substrate adjacent to a first side of the polar insulation layer; and
    forming a second well in the semiconductor substrate adjacent to a second side of the polar insulation layer, the second side being opposite the first side, wherein the semiconductor substrate has a first conductivity type and the first and second wells have a second conductivity type, the second conductivity type being opposite the first conductivity type.

16. The method of claim 15, wherein forming the polar insulation layer on the semiconductor substrate comprises forming a phosphosilicate glass layer on a silicon carbide substrate.

17. The method of claim 16, wherein forming the phosphosilicate glass layer comprises:
    growing a thermal oxide layer on the silicon carbide substrate; and
    annealing the thermal oxide layer in a gas comprising phosphorus to convert the thermal oxide layer to the phosphosilicate glass layer.

18. The method of claim 15, wherein the thickness of the non-polar insulation layer is greater than seventy-five percent of a combined thickness of the polar and non-polar insulation layers.

19. The method of claim 15, wherein the thickness of the non-polar insulation layer is between eighty-five percent and ninety-five percent of a combined thickness of the polar and non-polar insulation layers.

* * * * *